(12) United States Patent
Tan et al.

(10) Patent No.: US 8,836,036 B2
(45) Date of Patent: Sep. 16, 2014

(54) METHOD FOR FABRICATING SEMICONDUCTOR DEVICES USING STRESS ENGINEERING

(75) Inventors: Shyue Seng Tan, Singapore (SG); Lee Wee Teo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 402 days.

(21) Appl. No.: 12/776,437

(22) Filed: May 10, 2010

(65) Prior Publication Data

US 2011/0163357 A1   Jul. 7, 2011

Related U.S. Application Data

(60) Provisional application No. 61/292,476, filed on Jan. 5, 2010.

(51) Int. Cl.
| | |
|---|---|
| *H01L 21/70* | (2006.01) |
| *H01L 21/336* | (2006.01) |
| *H01L 29/78* | (2006.01) |
| *H01L 21/265* | (2006.01) |
| *H01L 29/66* | (2006.01) |

(52) U.S. Cl.
CPC ...... *H01L 21/26506* (2013.01); *H01L 29/7833* (2013.01); *H01L 29/7848* (2013.01); *H01L 21/265* (2013.01); *H01L 29/6656* (2013.01); *H01L 29/6659* (2013.01); *H01L 29/7843* (2013.01)

USPC ............ 257/368; 257/E21.619; 438/299

(58) Field of Classification Search
None
See application file for complete search history.

(56) References Cited

U.S. PATENT DOCUMENTS

| | | | | |
|---|---|---|---|---|
| 6,590,291 | B2 * | 7/2003 | Akagawa | 257/774 |
| 7,279,758 | B1 * | 10/2007 | Li et al. | 257/408 |
| 2007/0141775 | A1 * | 6/2007 | Teo et al. | 438/231 |
| 2007/0232033 | A1 * | 10/2007 | Wieczorek et al. | 438/482 |
| 2008/0128806 | A1 * | 6/2008 | Liu et al. | 257/347 |
| 2008/0191243 | A1 * | 8/2008 | Liu et al. | 257/190 |
| 2011/0027956 | A1 * | 2/2011 | Domenicucci et al. | 438/301 |

* cited by examiner

*Primary Examiner* — Michael Lebentritt
*Assistant Examiner* — Kevin Quinto
(74) *Attorney, Agent, or Firm* — Horizon IP Pte Ltd

(57) ABSTRACT

A method for fabricating a semiconductor device is presented. The method comprises providing a gate stack including a gate dielectric and gate electrode over a substrate. Stressor regions comprising stressor material incorporated into substitutional sites of the substrate are formed within the substrate on opposed sides of the gate stack. A first stressor layer having a first stress value is formed over the semiconductor device after forming the stressor regions followed by an anneal to memorize at least a portion of the first stress value in the semiconductor device, wherein the anneal is conducted at a low temperature.

21 Claims, 12 Drawing Sheets

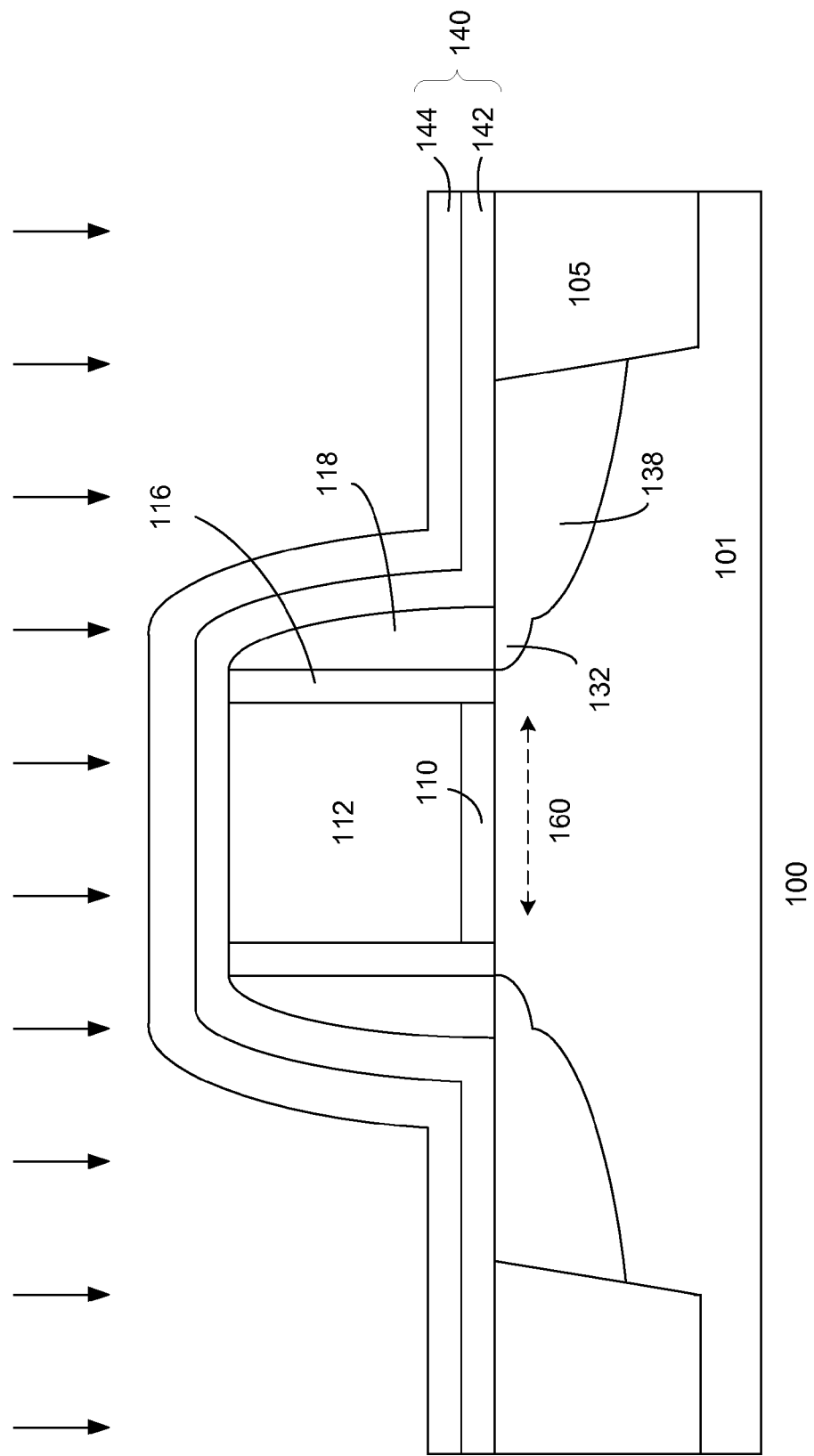

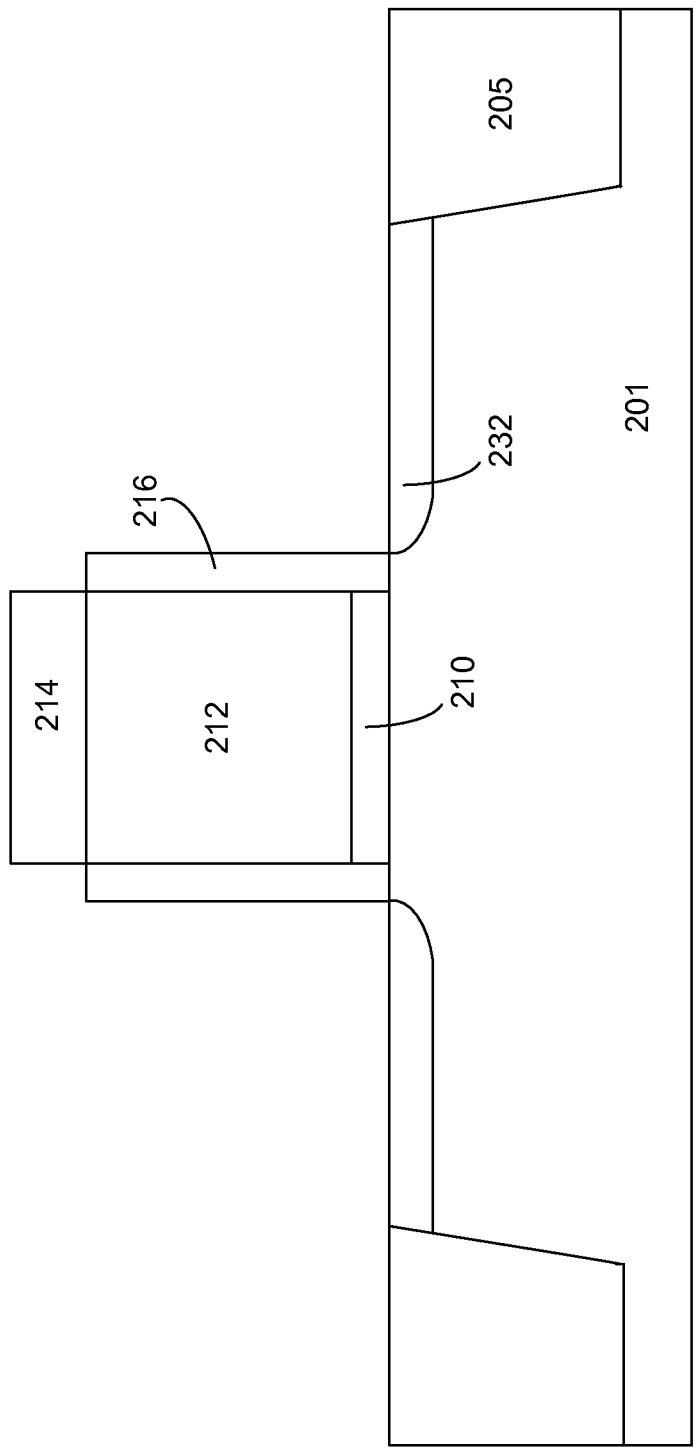

METHOD FOR FABRICATING SEMICONDUCTOR DEVICES USING STRESS ENGINEERING

CROSS-REFERENCES TO RELATED APPLICATIONS

This application claims the benefit of U.S. provisional application No. 61/292,476, filed Jan. 5, 2010, entitled "Method for Fabricating Semiconductor Devices Using Stress Engineering", the entire content of which is herein incorporated by reference.

TECHNICAL FIELD

The present invention relates generally to methods for fabricating semiconductor devices, and more particularly to methods for improving carrier mobility in semiconductor devices using stress engineering.

BACKGROUND ART

Integrated circuits (ICs) comprising many tens of thousands of semiconductor devices including field effect transistors (FETs) are a cornerstone of modern microelectronic systems. A common active device within an integrated circuit is the metal-oxide-semiconductor field effect transistor (MOSFET). A MOSFET typically comprises a gate stack composed of a gate electrode and an underlying gate dielectric. The gate stack is formed over a semiconductor substrate with a source and a drain diffusion region formed within the substrate on opposed sides of the gate stack. A channel region is located under the gate dielectric and between the source and drain regions. During operation, the channel region is converted to an "inversion mode" where a conductive path is formed to link the source and drain when a voltage is applied to the gate electrode.

One of the factors influencing the amount of current flow through a MOSFET channel is the mobility of carriers within the channel region. Specifically, an increase in the mobility of carriers in the transistor channel leads to a higher current during operation and a correspondingly faster device operation. Therefore, semiconductor device structures and methods of fabrication that lead to increased mobility of carriers in the channel region are desirable.

SUMMARY OF THE INVENTION

The present invention relates to semiconductor devices and in particular, to semiconductor devices that utilize strain engineering.

In accordance with a first aspect of the invention, there is a method provided for fabricating a semiconductor device comprising forming a gate stack comprising a gate dielectric and gate electrode over a substrate and forming stressor regions within the substrate on opposed sides of the gate stack, the stressor regions comprising stressor material incorporated into substitutional sites of the substrate. A first stressor layer having a first stress value is formed over the substrate after forming the stressor regions and an anneal carried out to memorize at least a portion of the first stress value in the semiconductor device, wherein the anneal is conducted at a low temperature.

In accordance with a second aspect of the invention, there is provided a semiconductor device comprising a gate stack formed over a substrate, a stressor region within the substrate on opposed sides of the gate stack and a first stressor layer having a first stress value. The gate stack comprises a gate dielectric and gate electrode, and the stressor region comprises stressor material incorporated in substitutional sites of the substrate. The first stressor layer includes lateral portions adjacent to a surface of the substrate wherein the stressor regions are located closer to an edge of the gate stack compared to the lateral portions of the first stressor layer.

These and other objects, along with advantages and features of the present invention herein disclosed, will become apparent through reference to the following description and the accompanying drawings. Furthermore, it is understood that the features of the various embodiments described herein are not mutually exclusive and can exist in various combinations and permutations.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which:

FIGS. 1a to 1g are schematic cross-sectional views illustrating the results of progressive stages in fabricating a semiconductor structure in accordance with a first embodiment of the invention; and FIGS. 2a to 2e are schematic cross-sectional views illustrating the results of progressive stages in fabricating a semiconductor structure in accordance with a second embodiment of the invention.

DETAILED DESCRIPTION

The following embodiments are described in sufficient detail to enable those skilled in the art to make and use the invention. It is to be appreciated that other embodiments would be evident based on the present disclosure, and that system, process, or mechanical changes may be made without departing from the scope of the present invention.

Generally, the following embodiments relate to methods of fabricating a semiconductor device comprising the formation of stressor regions with stressor atoms incorporated into substitutional positions and use of stress memorization techniques. The inventors have found that by controlling processing conditions of the stress memorization technique anneal and dopant activation anneal, the stressor regions can be formed in closer proximity to a conduction channel of a semiconductor device. Increased proximity between the stressor regions and a conduction channel increases the stress induced on the latter by the stressor regions thus leading to improved device performance such as drive current and sub-threshold leakage for a given drive current.

FIGS. 1a to 1g are cross-sectional views illustrating process steps for fabricating a n-channel Metal Oxide Field Effect Transistor (NMOS) in accordance with a first embodiment of the invention. It should be noted, however, that embodiments of the invention are described in the context of fabricating an NMOS for illustrative purposes only and that the invention may also be applicable to the fabrication of other semiconductor devices such as but not limited to p-channel MOSFETs (PMOS), multi-gate transistors and annular gate transistors.

Additionally, it is to be understood that a plurality of conventional processes that are well known in the art and not repeated herein, may precede or follow FIGS. 1a-1g. More-over, it is to be understood that many modifications, additions, and/or omissions may be made to the below described process without departing from the scope or spirit of the claimed subject matter. For example, the below described process may include fewer, or more steps. Also, it is to be appreciated that the present disclosure need not be limited to the initial semiconductor structure depicted by FIG. 1a.

Figure 1A:
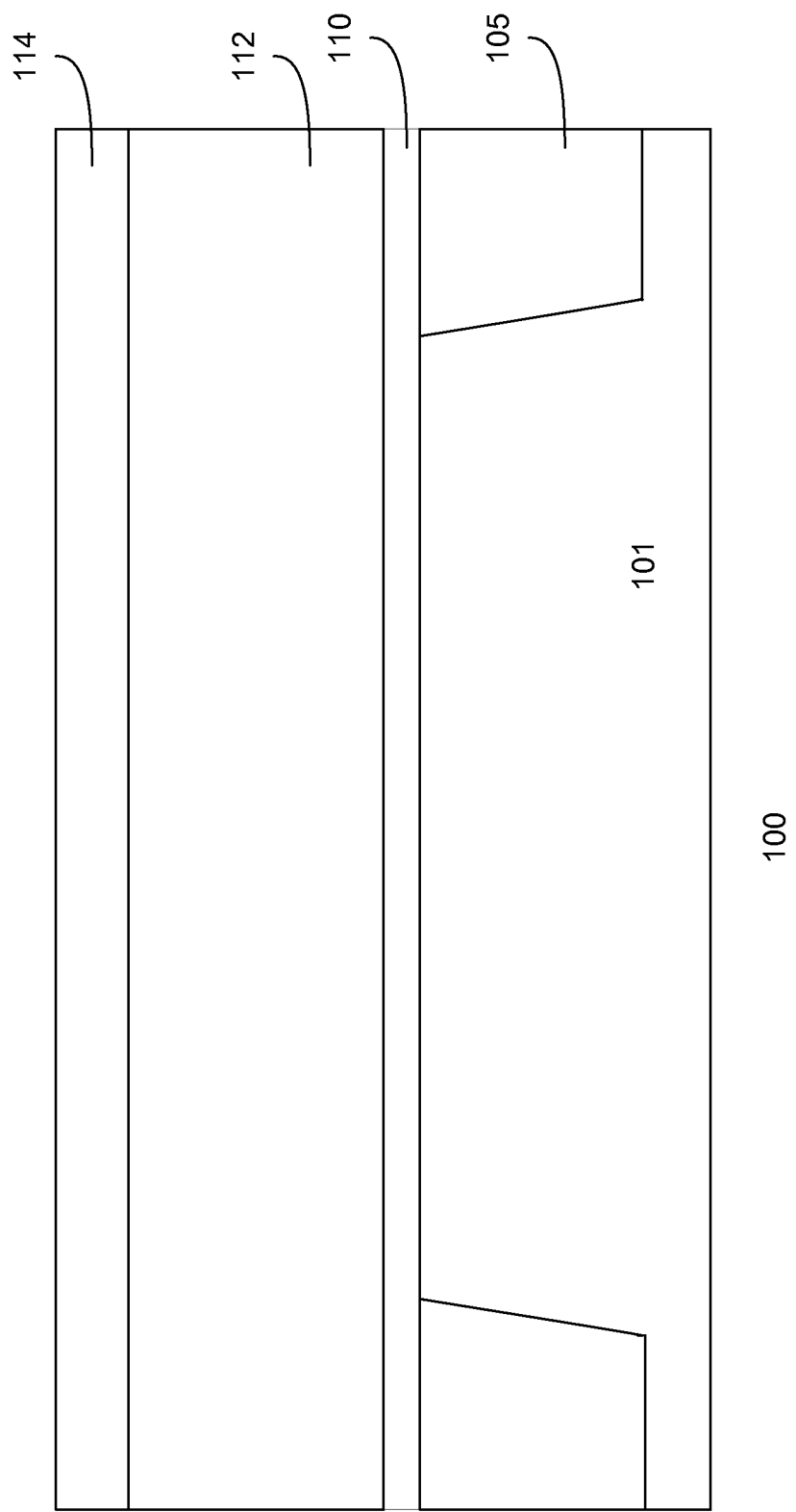

Referring now to FIG. 1a, therein is shown a semiconductor structure 100 comprising a semiconductor substrate 101 and shallow trench isolation (STI) structures 105 formed within the substrate to isolate active regions. Alternatively, other isolation structures such as field oxide isolation structures may also be used to isolate active regions. A gate dielectric material 110 is deposited over surface of the substrate 101 followed by a layer of gate electrode material 112 and a gate capping layer 114. The gate capping layer 114 is made of materials and has a thickness that is capable of preventing stressor atoms from being implanted into the gate electrode layer 112 during a subsequent stressor implant step. In one embodiment, the gate electrode layer 112 is made of polysilicon and the gate capping layer 114 is a poly capping layer. Materials such as $SiO_2$, SiON, SiN, SiC, or combinations thereof may be used as a poly capping layer 114. Alternatively, other materials that are suitable as an implant mask may also be used.

Each of the foregoing substrate 101, gate dielectric layer 110 and gate electrode layer 112 are generally conventional in the semiconductor fabrication art. By way of example, the substrate may include any semiconducting material such as Si, SiC, SiGe, Si/SiGe, or a combination of semiconducting and insulating materials such as silicon-on-insulator (SOI) configurations. The substrate 101 may also include one or more crystal orientations (e.g. (100) and/or (110) orientations), which may be strategically employed to enhance carrier mobility of devices being fabricated. In the presently described embodiment, the substrate 101 comprises a p-type substrate in which an NMOS transistor may be fabricated. Alternatively, an n-type substrate comprising a p-type well within which the NMOS is formed may also be used. As for the gate dielectric layer 110 it may comprise a dielectric material such as silicon dioxide, silicon oxynitride, silicon nitride, a high-K metal oxide or a combination thereof. Alternatively, other dielectric materials may also be used. The gate dielectric 110 may be deposited using methods such as thermal oxidation, chemical vapour deposition, rapid thermal oxidation or the like as known in the art. Finally, the gate electrode layer 112 may comprise a conductive or semi-conductive material. Non-limiting examples include doped polysilicon, a metal silicide or a combination thereof.

Figure 1B:
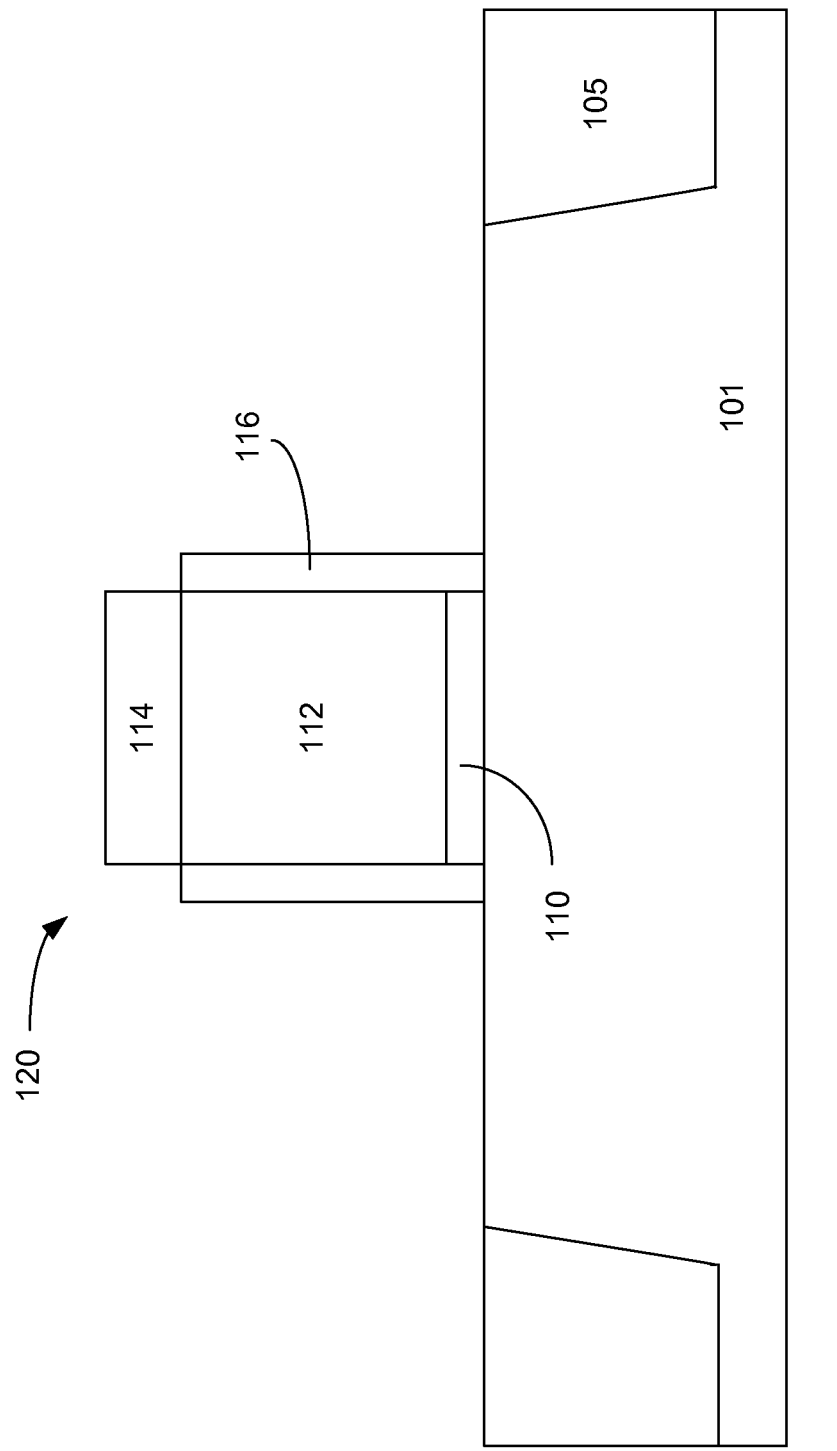

FIG. 1b shows the results of patterning the gate dielectric layer 110, gate electrode layer 112 and gate capping layer 114 of FIG. 1a to form a gate stack 120. Conventional patterning methods such as lithography patterning using photoresist followed by sequential etching of exposed portions of the gate capping layer 114, gate electrode layer 112 and gate dielectric layer 110 not covered by photoresist may be utilized. After etching is completed, the photoresist mask is removed.

First spacers 116 are subsequently formed along the sidewalls of the gate electrode 112 and gate dielectric 110 as shown in FIG. 1b. In one embodiment, the first spacers 116 comprise silicon oxide and are formed by thermal oxidation. Alternatively, the first spacers may be composed of other dielectric materials such as silicon nitride or a combination of more than one layer of dielectric material. In another embodiment, the first spacers may be extended to abut the sidewalls of the gate capping layer 114 and the first spacers may also be formed by blanket deposition of first spacer layer e.g. by chemical vapor deposition followed by an anisotropic etch process to remove lateral portions thereof.

Figure 1C:
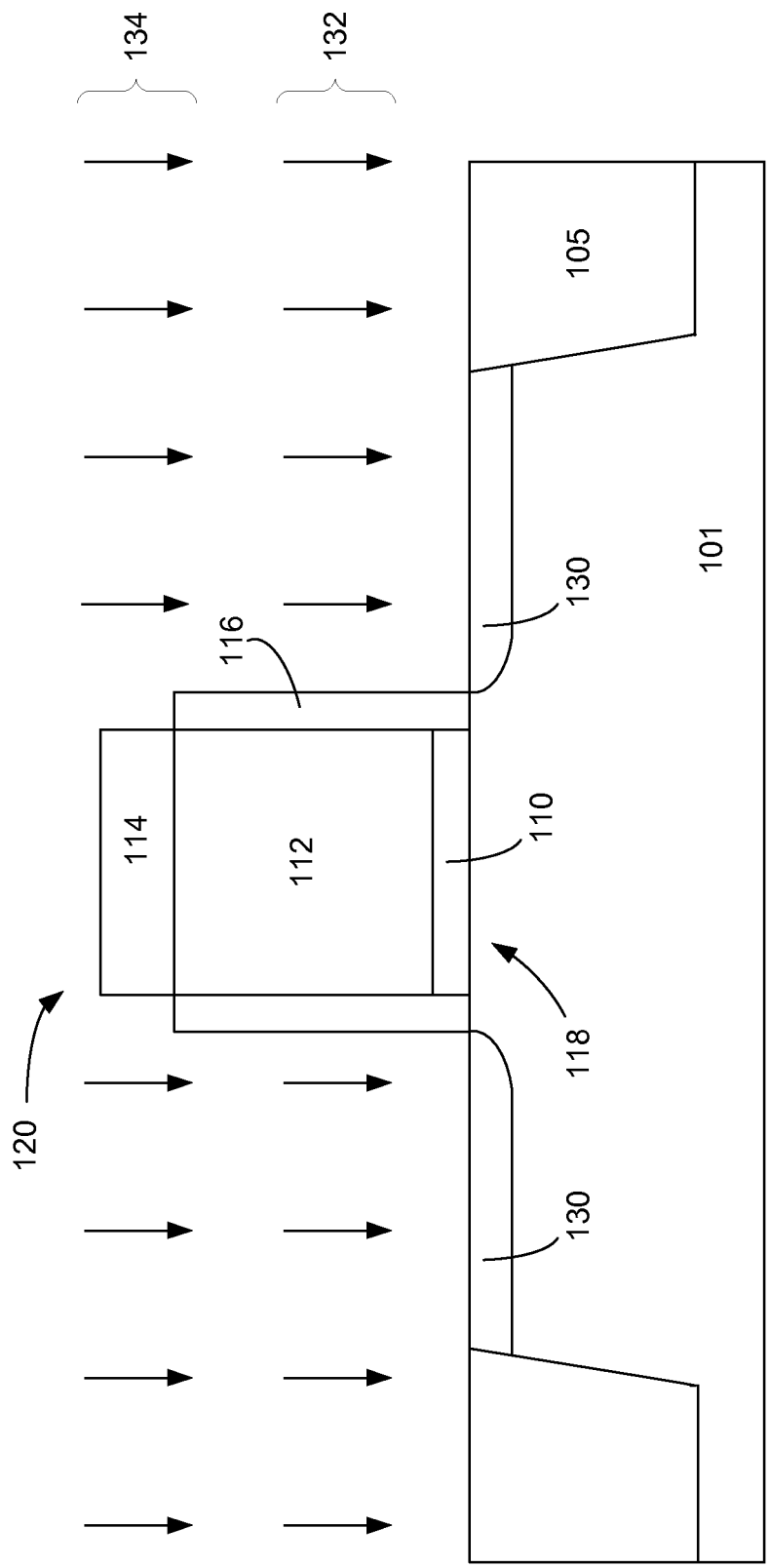

FIG. 1c shows the semiconductor structure 100 of FIG. 1b during the formation of stressor implanted n-type source drain extension (NSDE) regions 130 within the substrate on opposed sides of the gate stack 120. Stressor implanted NSDE regions 130 are n-doped source drain extension regions which have been implanted with one or more species of stressor atoms. Stressor atoms are elements having a lattice constant substantially different from that of the substrate material. For example, it has been discovered that elements having a lattice constant that deviate from that of the substrate by more than 2% and preferably more than 4% may be suitable as stressor atoms. When a sufficient amount of stressor atoms are incorporated into substitutional sites of a substrate region adjacent to the channel of a transistor (such as the source drain extension and/or source drain region) the lattice constant of that substrate region is modified thereby creating a strain in the adjacent channel region.

Stressor material may be introduced by implanting one or more species of stressor atoms (denoted by arrows 132) into designated NSDE diffusion regions of the substrate 101. The stressor atoms as implanted occupy random positions and at this point the NSDE regions 130 do not function as stressor regions. In order for the stressor implanted NSDE regions 130 to induce stress in an adjacent channel region, it is necessary to incorporate a sufficient amount of stressor atoms into substitutional positions. A separate process step described in the succeeding paragraphs is used to incorporate the stressor atoms into substitutional sites. In FIG. 1c, the channel region 118 is located within the substrate 101 and under the gate dielectric 110.

Following the introduction of stressor species, first dopant species (denoted by arrows 134) are implanted into the substrate 100 to form NSDE diffusion regions. Alternatively, the implant sequence may also be reversed with first dopants being implanted before the stressor species. The first spacers 116 act as a mask during the implantation processes thereby offsetting the edges of the stressor implanted NSDE regions 130 from the edges of the gate electrode 112 by a distance approximately equivalent to the base width of the first spacers 116. In FIG. 1c, the stressor material has an implant range that is approximately the same as that for the first dopant species. This results in the stressor material being distributed substantially throughout the depth of the NSDE region as implanted. Alternatively, the stressor implant conditions may also be tuned such that stressor material is substantially confined within an upper portion of the NSDE region. In this case, only the upper portion of the NSDE is considered a stressor implanted NSDE. It is to be appreciated that a multitude of implant parameters such as implant energy, dose and angle may be adjusted to modulate the range of the stressor material and first dopants.

In one embodiment, the above described stressor or first dopant implants, or a combination thereof result in amorphization of the stressor implanted NSDE regions 130. Alternatively, a separate amorphization implant step such as but not limited to a halo implant may also be used to amorphize the stressor implanted NSDE regions 130. The amorphization depth is preferably equal to or greater than the depth of the stressor implanted NSDE regions.

In general, the mobility of carriers in an NMOS channel region is enhanced by horizontal tensile stress. Therefore, in the context of forming an NMOS as shown FIG. 1c, a stressor material with a lattice constant smaller than that of the substrate material is introduced so that upon subsequent incorporation of the stressor atoms into substitutional sites, horizontal tensile stress is induced in the channel region 118. In one embodiment, Carbon which has a lattice constant of 3.567 Å at 27° C. compared to 5.431 Å for silicon is implanted into a designated NSDE region of a silicon substrate. Carbon may be implanted into the substrate at an energy of 5-20 KeV and a dose of 1E15 to 8E15 $cm^{-2}$. Alternatively, other implant conditions may also be suitable. The carbon dose should be high enough to ensure the efficacy of carbon as stressor material. Preferably, the carbon dose is kept at 1E14 $cm^{-2}$ and above.

As for formation of the NSDE diffusion region, the first dopant species 134 may comprise n-type dopants such as but not limited to Phosphorus, Arsenic or compounds thereof. It is to be appreciated that a multitude of implantation parameters such as implant energy, implant dose and implant angle can be adjusted to modulate the concentration and projected range of the stressor material and first dopant species within the substrate 101.

Figure 1D:
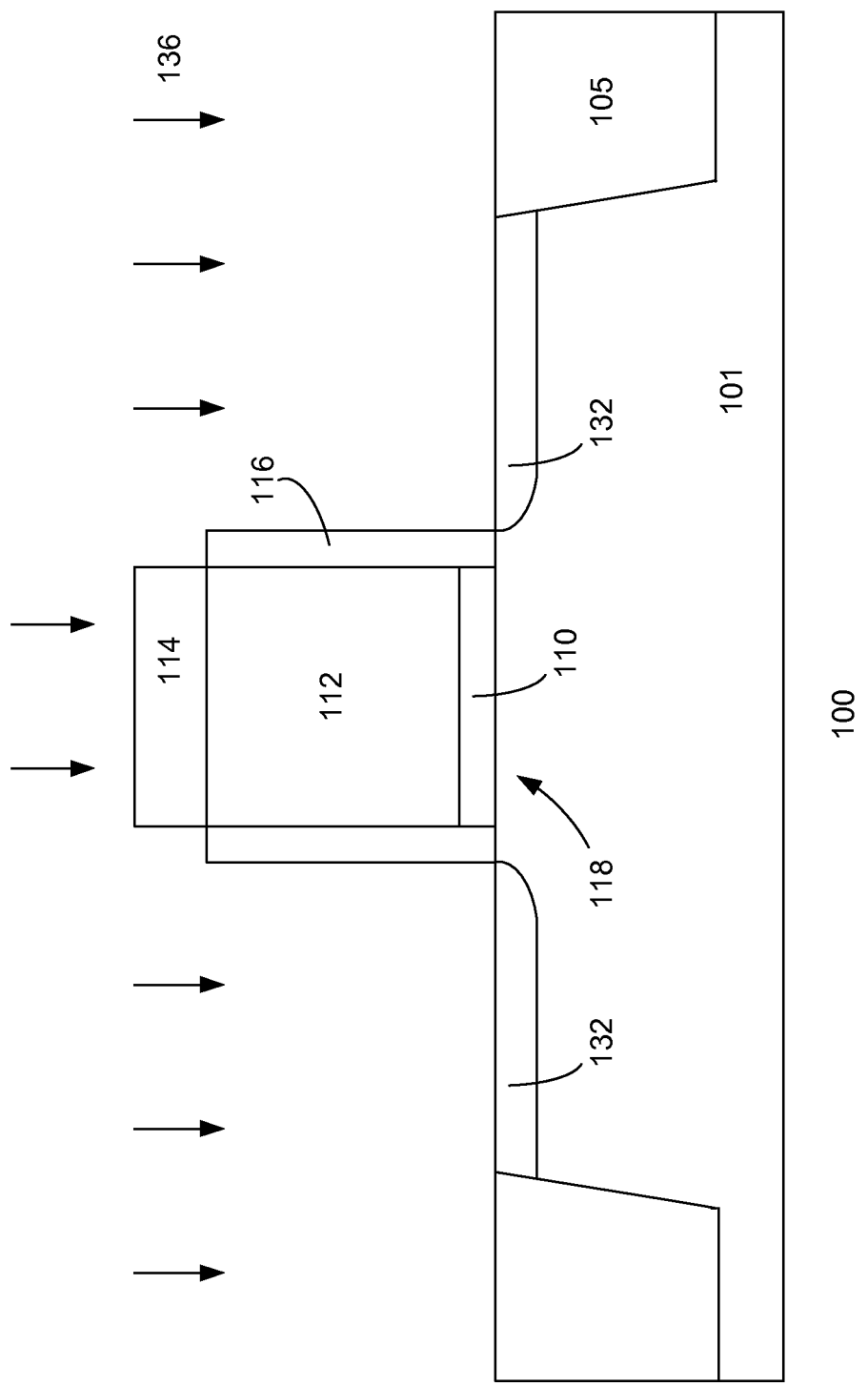

FIG. 1d shows the semiconductor structure of FIG. 1c during a laser anneal step that converts the stressor implanted NSDE regions of FIG. 1c into crystalline NSDE stressor regions 132. The crystalline NSDE stressor regions 132 have a different lattice constant from the substrate 101 and this mismatch in lattice constant results in stress being induced in the adjacent channel region 118.

Arrows 136 depict the irradiation of laser fluence in a laser anneal step that is configured to incorporate at least a portion of the implanted stressor atoms into substitutional sites and recrystallize the stressor implanted NSDE regions 130. In order to form for the NSDE regions to function as stressor regions, there should be a sufficient concentration of stressor atoms incorporated into substitutional sites and the number of substitutional stressor atoms within the NSDE regions 132 should also exceed the number of interstitial stressor atoms. Preferably, the atomic concentration of substitutional stressor atoms in the NSDE regions 132 is at least 1%. In general, for a given species of stressor atoms, the magnitude of stress induced on a channel region increases with an increase in the stressor dose introduced at implantation and percentage of stressor atoms incorporated into substitutional sites.

In one embodiment, the laser anneal process comprises a solid phase epitaxy process. Laser process conditions such as intensity, energy and/or pulse duration are adjusted so that the stressor implanted NSDE regions are melted and after the laser energy is removed, the stressor implanted NSDE regions are converted into crystalline NSDE stressor regions 132. The laser process is controlled so that the substrate 101 is preferably not melted by the laser beam and structural integrity of other features such as the gate electrode and dielectric material are maintained. In one embodiment, laser process conditions may be tuned to provide an effective temperature range of 1000 to 1300° C. for a solid phase epitaxy process involving carbon atoms implanted into a NSDE region of a silicon substrate. The laser anneal duration may be in the millisecond range. An anti-reflective layer (not shown) may be applied over the substrate in order to enhance the absorption of laser energy.

In one embodiment, a silicon substrate 101 is provided and some of the silicon atoms in the SDE regions are substituted by carbon atoms incorporated into substitutional positions.

Figure 1E:
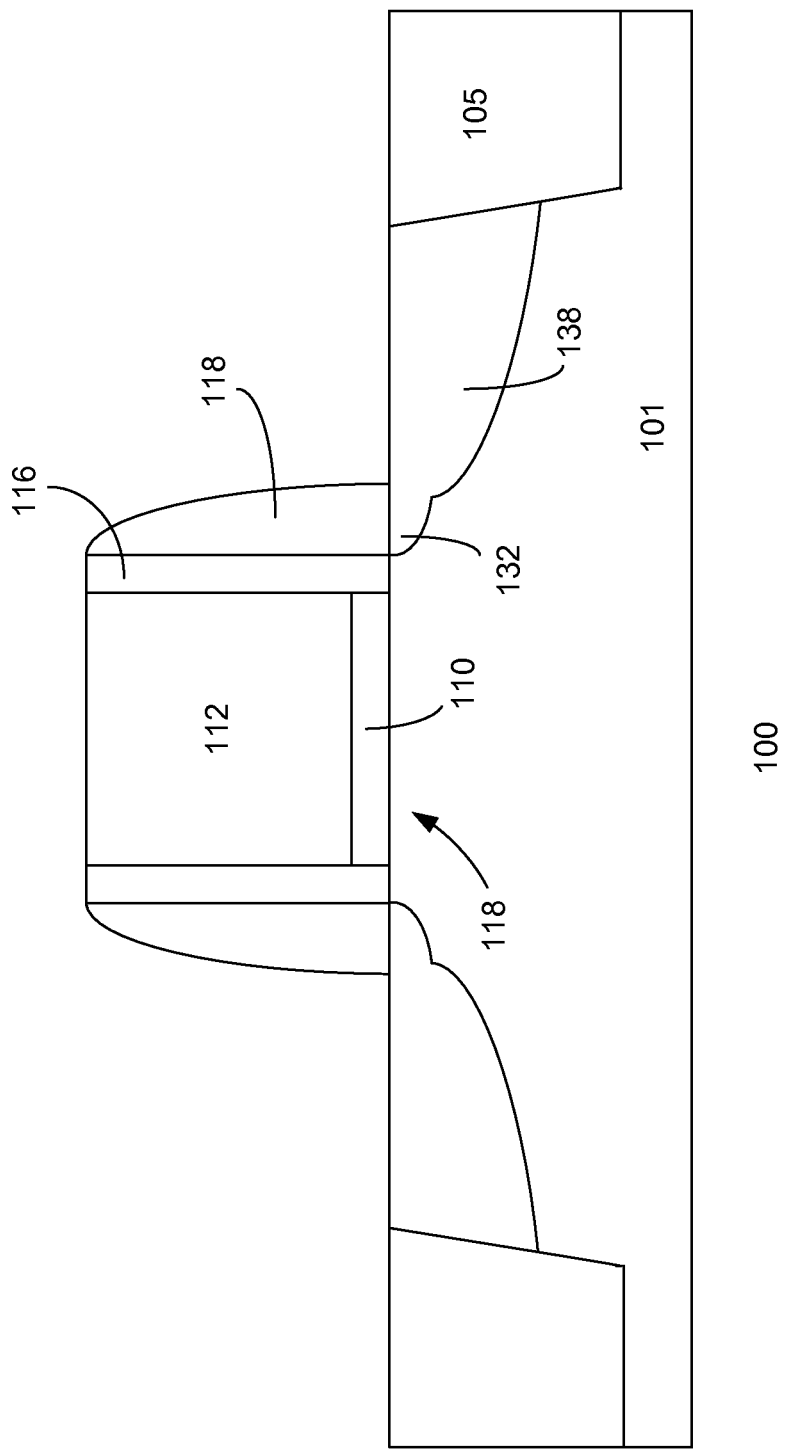

FIG. 1e shows the semiconductor structure 100 of FIG. 1d after removal of the gate capping layer 114 and formation of second spacers 118 along the sidewalls of the first spacers 116. The second spacers 118 may be formed by depositing a conformal dielectric layer and anisotropically etching the dielectric layer to remove lateral portions thereof. By way of example, the second offset spacers 118 may comprise a silicon nitride, silicon oxide, or silicon oxynitride. Alternatively, other dielectric materials may also be used and the second spacers 118 may also comprise multiple layers of dielectric material.

Following the formation of the second spacers 118, second dopants are introduced into the substrate via single or multiple implants to form NMOS source/drain diffusion regions 138. In FIG. 1e, the NMOS source/drain regions 138 are offset from the edge of the gate electrode 112 by the first and second spacers which act as a mask during implantation.

The NMOS source/drain regions 138 may be formed by implanting N-type dopants such as but not limited to Phosphorus, Arsenic or compounds thereof. In one embodiment, the NMOS source/drain implant may result in at least a portion of the substrate 101 and at least a portion of the gate electrode being amorphized.

Figure 1F:
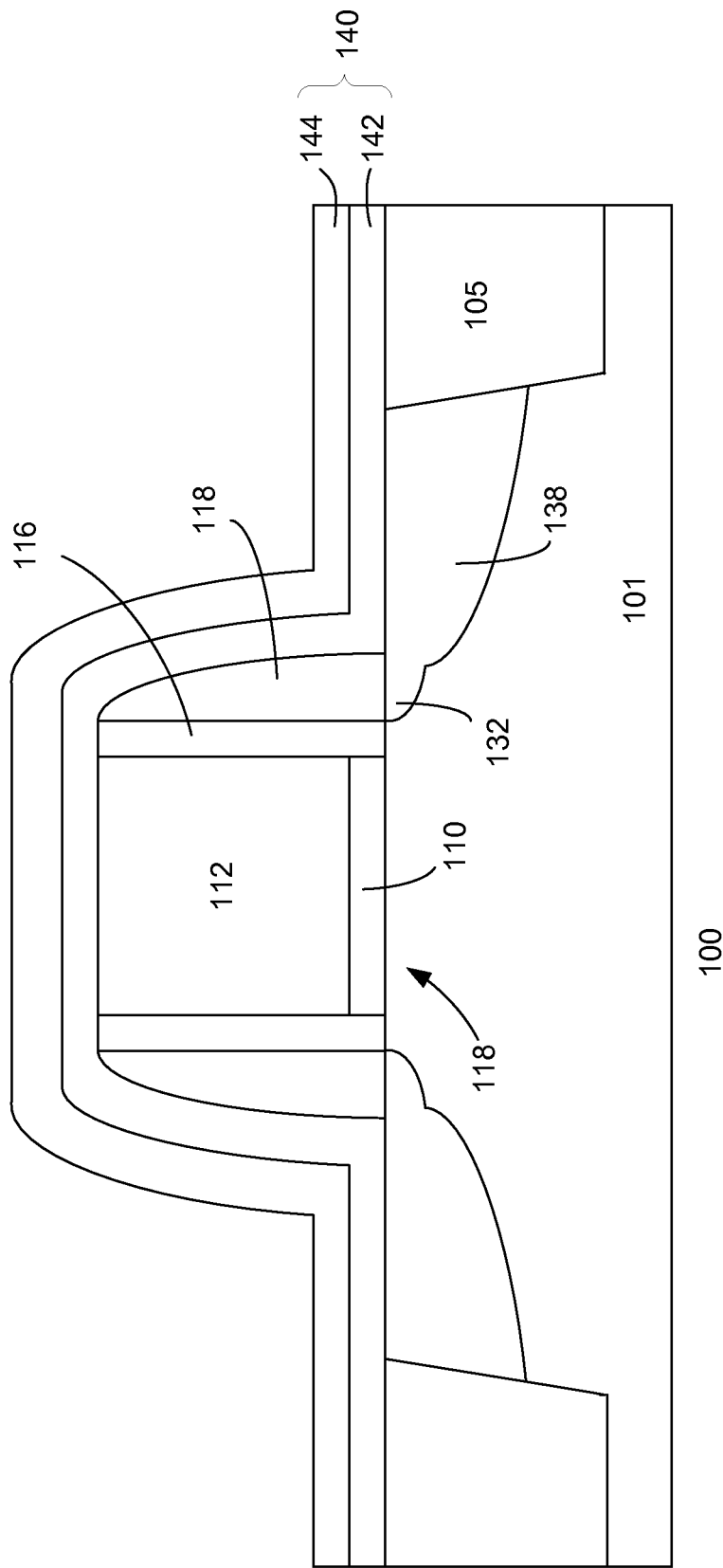

Referring now to FIG. 1f, therein is shown the semiconductor structure 100 of FIG. 1e after a stressor layer 140 is formed over the substrate 101 and gate electrode 112. The stressor layer 140 in FIG. 1f is a multi-layered structure comprising a liner layer 142 and a first stress layer 144. Preferably, the liner layer 142 has a high etch selectivity with respect to the first stress layer 144 thereby facilitating subsequent removal of the latter. The stressor layer 140 may also be a single layer structure or comprise more than two layers provided that the stressor layer 140 has a net tensile stress which enhances the mobility of carriers in an NMOS channel. In one embodiment, the net tensile stress of the stressor layer 140 may range from 0.5 $GPa/cm^2$ to 2 $GPa/cm^2$.

In one embodiment, the liner layer 142 is a silicon oxynitride (SiON) or silicon carbide (SiC) while the first stress layer 144 is a high tensile stress silicon nitride layer. Alternatively, other materials such as doped silicon or other combinations of materials may also be suitable provided the stressor layer 140 has a net tensile stress.

Exemplary methods for forming the stressor layer 140 include, but are not limited to chemical vapor deposition (CVD), physical vapor deposition (PVD), atomic layer deposition (ALD), high density plasma deposition (HDP) or thermal oxidation or a combination thereof. In one embodiment, the process parameters associated with the formation of one or more layers in the stressor layer 140 may be tuned to provide a layer with a desired level of stress. Exemplary process parameters that can be tuned include one or more of deposition temperature, pressure, and ion bombardment during deposition.

In one embodiment, portions of the stressor layer 140 overlying other device regions (not shown) such as PMOS transistor regions may be selectively removed before carrying out the stress memorization technique anneal step described in the succeeding paragraph.

FIG. 1g shows the semiconductor structure 100 of FIG. 1f in a stress memorization technique (SMT) anneal step configured so that at least a portion of the tensile stress from the stressor layer 140 is transmitted to and memorized by the NMOS in the form of tensile stress 160 along the lateral direction of the channel region 118. The tensile stress 160 induced by the stressor layer 140 enhances the mobility of carriers in the NMOS channel region and is more or less maintained even if the stressor layer 140 is subsequently removed. Without limiting ourselves to any particular theory, stress memorization may be caused by changes in portions of the gate electrode and/or substrate (such as re-crystallization) in the presence of an overlying stressor layer 140 during the SMT anneal.

Following the SMT anneal, a source/drain dopant activation anneal is carried out to activate dopants in the NMOS source/drain regions 138. The SMT and source/drain dopant activation anneal steps can result in the displacement of stressor atoms from substitutional sites to the extent that the stressor regions end up with a low atomic concentration of substitutional stressor atoms. This is undesirable because the stress induced by a stressor region decreases with a decrease in the atomic concentration of substitutional stressor atoms. Preferably, the atomic concentration of substitutional stressor atoms post SMT and dopant activation anneal is at least 1%. A possible method to avoid the displacement of stressor atoms is to form the stressor regions 132 after SMT and source/drain dopant activation anneal but this means that the stressor regions would have to be located at the NSD 138 instead of the NSDE 132. As evident from FIG. 1g, the NSD regions 138 are located further away from the edges of the gate electrode compared to the NSDE 132 thereby reducing the efficacy of the stressor regions in stress inducement.

The inventors have discovered that a combination of low temperature SMT anneal and a source/drain dopant activation laser spike anneal (LSA) can be used to reduce the displacement of substitutional stressor atoms during SMT and activation anneal. In one embodiment, the concentration of substitutional stressor atoms present after various processing steps may be measured using x-ray diffraction.

A low temperature SMT anneal is an anneal process that is carried out at a temperature of about 700° C. or less. The temperature range at the lower end being bounded by the need to effect the transfer of stress to and memorization of transferred stress by the channel region 118. Comparison of transistor characteristics such as drive current may be used to determine the effectiveness of an SMT anneal. The inventors have discovered that a high temperature SMT anneal exceeding 700° C. can result in substantial displacement of stressor atoms from substitutional sites. For example, the inventors have found that a laser SMT anneal at 1200° C. causes the atomic concentration of substitutional stressors to fall below 1%. Reducing the SMT anneal duration to maintain the stressor concentration at 1% or above while maintaining a temperature above 700° C. does not mitigate the problem because this inhibits the transfer and memorization of stress from the stressor layer 250 to the channel region.

In a preferred embodiment, the temperature range for the SMT anneal is between 550 to 650° C. and even more preferably, a furnace anneal process is used so that there is an effective transfer of stress from the stressor layer 140 to the channel while mitigating displacement of stressor atoms from substitutional sites. In one embodiment, the SMT anneal comprises a furnace anneal at 650° C. for a duration of between 10 to 30 minutes.

Meanwhile, the source/drain dopant activation LSA is a laser based anneal with a radiation duration in the sub millisecond range and an effective anneal temperature of more than 1000° C. The temperature range at the upper end is bounded by the melting temperature of the substrate and the need to minimize reductions in the atomic concentration of substitutional stressors. For example, in embodiments where the device is fabricated on a silicon substrate, the maximum effective temperature may be around 1300° C. so as to prevent the silicon substrate from melting.

In one embodiment, the stressor layer 140 is removed after SMT anneal. The stressor layer may be removed by an etch process that is selective with respect to the gate electrode 112 and the substrate material.

It will be appreciated by those skilled in the art that after source/drain activation anneal, additional conventional steps such as silicide contact formation, interconnect formation etc. can be performed as desired for the formation of an NMOS transistor.

FIGS. 2a to 2e are cross-sectional views illustrating process steps for fabricating a NMOS in accordance with another embodiment of the present invention. It should be noted, that similar to the embodiment FIG. 1a-1g, the second embodiment is described in the context of fabricating an NMOS for illustrative purposes only and that the invention may also be applicable to the fabrication of other semiconductor devices such as but not limited to p-channel MOSFETs (PMOS), multi-gate transistors and annular gate transistors. Additionally, it is to be understood that many modifications, additions, and/or omissions may be made to the below described process without departing from the scope or spirit of the claimed subject matter. For example, the below described process may include fewer or more steps.

Referring now to FIG. 2a, therein is shown a semiconductor structure 200 at a point of processing after the laser anneal step of FIG. 1d. The semiconductor structure 200 comprises a substrate 201 with shallow trench isolation structures 205 formed within to isolate active regions. A gate stack is provided over the substrate 201. The gate stack comprising a gate dielectric 210, a gate electrode 212 overlying the gate dielectric 210 and a gate capping layer 214 covering the top of the gate electrode 212. First spacers 216 extend along the sidewalls of the gate dielectric 210 and gate electrode 212. A channel region 218 is located within the substrate and between crystalline n-type source drain extension (NSDE) stressor regions 232. The NSDE regions 232 are offset from the edge of the gate electrode 212 by approximately the width of the first spacers 216.

Figure 2B:
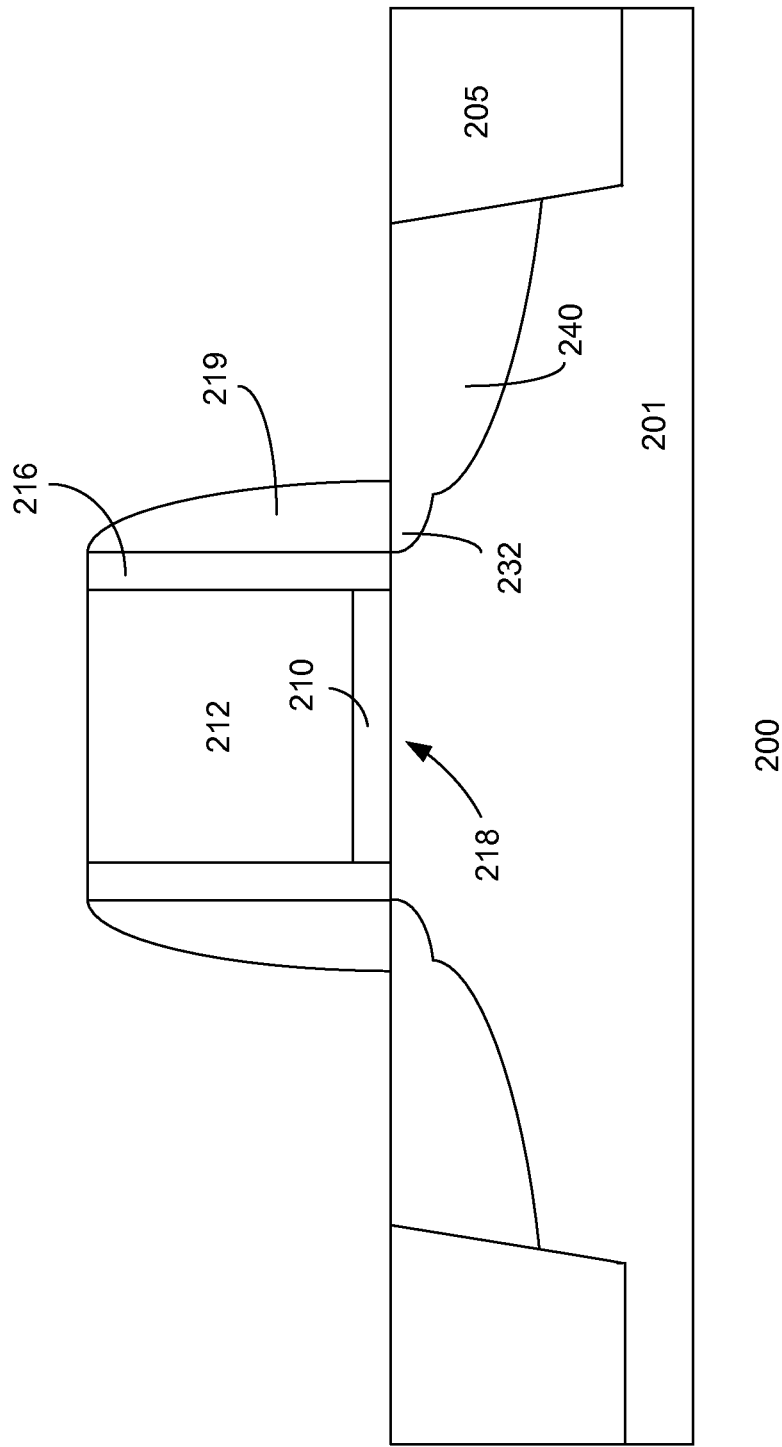

FIG. 2b shows the semiconductor structure 200 of FIG. 2a after removal of the gate capping layer 214 and formation of second spacers 219 along the sidewalls of the first spacers 216. The second spacers 219 may be formed by depositing a conformal dielectric layer and anisotropically etching the dielectric layer to remove lateral portions thereof. By way of example, the second offset spacers 219 may comprise a silicon nitride, silicon oxide, or silicon oxynitride. Alternatively, other dielectric materials may also be used and the second spacers 219 may also comprise multiple layers of dielectric material.

Following the formation of the second spacers 219, stressor implanted n-type source/drain (NSD) regions 240 are formed in the substrate. Stressor implanted NSD regions 240 are n-type source/drain regions implanted with one or more species of stressor atoms. The stressor implanted NSD regions 24 may be formed by implanting n-type dopants into the substrate to form NSD diffusion regions followed by the implantation of one or more species of stressor atoms into the NSD regions. Alternatively, the implant sequence may also be reversed with stressor atoms being implanted first. In one embodiment, the first and second spacers operate as a mask during implantation. This results in the edges of the stressor implanted NSD regions 240 being offset from a corresponding edge of the gate electrode 212 by a distance approximately equivalent to the combined base width of first and second spacers as shown in FIG. 2b.

The stressor atoms as implanted occupy random positions and a subsequent process step is needed to incorporate a sufficient amount of stressor atoms into substitutional positions so that the lattice constant of the NSD regions 240 is modified and the NSD regions 240 are capable of inducing stress in the channel region 218.

Source/drain dopants and stressor atoms may be introduced into the substrate via single or multiple implant steps.

In FIG. 2b, the stressor material has an implant range that is approximately the same as that for the source/drain dopant species. This results in the stressor material being distributed throughout the depth of the NSD region as implanted. Alternatively, the stressor implant conditions may also be tuned such that stressor material is substantially confined within an upper portion of the NSD region. In this case, only the upper portion of the NSD is a stressor implanted NSD region. It is to be appreciated that a multitude of implantation parameters such as implant energy, implant dose and implant angle can be adjusted to modulate the concentration and projected range of the stressor material and first dopant species within the substrate 201.

In one embodiment, the stressor implanted NSD regions 240 in FIG. 2b may be amorphized by the above mentioned source/drain or stressor implants, or a combination thereof. Alternatively, the stressor implanted NSD regions 240 may be also be amorphized by a separate amorphization implant step. The amorphization depth is preferably equal to or greater than the depth of the stressor implanted NSD regions 240.

The NSD regions may be formed by implanting n-type dopants such as but not limited to Phosphorus, Arsenic or compounds thereof into the substrate. As for stressor atoms, one or more species of stressor elements having a lattice constant smaller than that of the substrate material is chosen so as to induce a horizontal tensile stress in a channel region 218 of the NMOS when the stressor atoms are subsequently incorporated into substitutional sites. In one embodiment, Carbon which has a lattice constant of 3.567 Å at 27° C. compared to 5.431 Å for silicon is implanted into a designated NSD region of a silicon substrate. Carbon may be implanted into the substrate at an energy of 5-20 keV and a dose of 1E15 to 8E15 cm$^{-2}$. Alternatively, other implant conditions may also be suitable. Preferably, the carbon dose is kept at 1E14 cm$^{-2}$ and above in order to ensure efficacy of carbon as a stressor material.

Figure 2C:
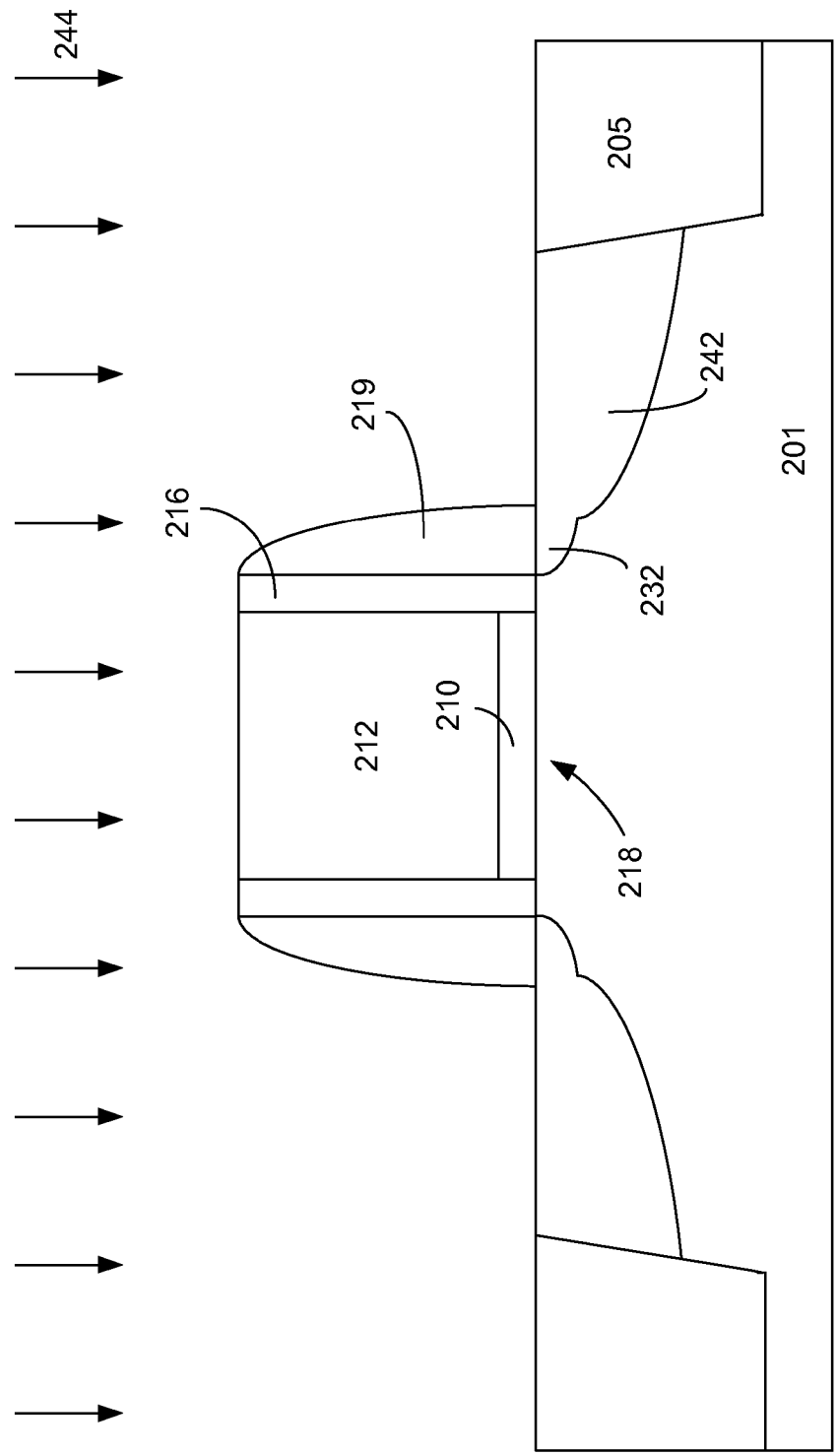

FIG. 2c shows the semiconductor structure of FIG. 2b during a laser anneal step that converts the amorphous stressor implanted NSD regions 240 of FIG. 2b into crystalline NSD stressor regions 242. The NSD stressor regions 242 have a different lattice constant from the substrate 201 and the mismatch in lattice constant results in stress being induced in the adjacent channel region 218 of the transistor. Arrows 244 depict the irradiation of laser fluence in a laser anneal step that is configured to incorporate at least a portion of the implanted stressor atoms into substitutional sites and recrystallize the amorphous stressor implanted NSD regions 240. In order to form for the NSD regions to function as stressor regions, there should be a sufficient concentration of stressor atoms incorporated into substitutional sites and the number of substitutional stressor atoms within the NSD regions 242 should also exceed the number of interstitial stressor atoms. Preferably, the atomic concentration of substitutional stressor atoms in the NSD regions 242 should be at least 1%. In general, for a given species of stressor atoms, the magnitude of stress induced on a channel region increases with an increase in the stressor dose introduced at implantation and amount of stressor atoms incorporated into substitutional sites.

The stressor atoms introduced into the NSD regions are chosen so that the stress induced on the channel region by the NSD stressor regions 242 and NSDE stressor regions 232 are both of the same nature, that is, tensile for the case of an NMOS. The NSD stressor regions 242 advantageously increase the volume of substitutional stressor atoms thereby allowing the amount of tensile stress induced in the channel region 218 to be increased.

In one embodiment, the laser anneal process comprises a solid phase epitaxy process. Laser process conditions such as intensity, energy and/or pulse duration are adjusted so that the stressor implanted NSD regions are melted and after the laser energy is removed, the stressor implanted NSD regions 240 are recrystallized and converted into crystalline NSD stressor regions 242 with at least a portion of the stressor atoms incorporated into substitutional positions. The laser process is controlled so that the substrate 101 is preferably not melted by the laser beam and structural integrity of other features such as the gate electrode and dielectric material forming the various layers are maintained. In one embodiment, laser process conditions may be tuned to provide an effective temperature range of 1000 to 1300° C. for a solid phase epitaxy process involving carbon atoms implanted into a NSD region of a silicon substrate. The laser anneal duration may be in the millisecond range. An anti-reflective layer may be applied over the substrate in order to enhance the absorption of laser energy.

In one embodiment, a silicon substrate 101 is provided and some of the silicon atoms in the NSD region may be substituted by carbon stressor atoms incorporated into substitutional positions.

Figure 2D:
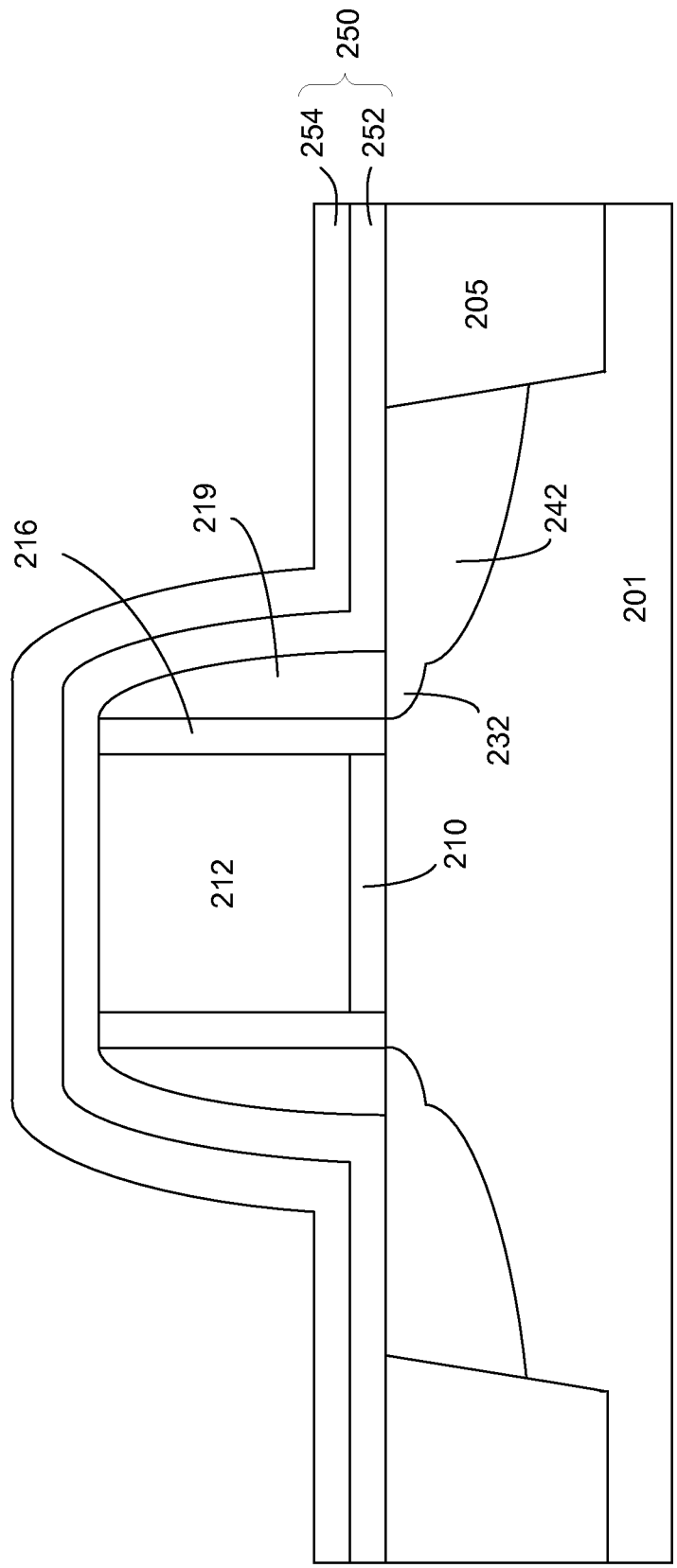

Referring now to FIG. 2d, therein is shown the semiconductor structure 200 of FIG. 2c after a stressor layer 250 is formed over the substrate 201 and gate electrode 212. In FIG. 2d, the stressor layer 250 is a multi-layered structure comprising a liner layer 252 and a stress layer 254. Preferably, the liner layer 252 has a high etch selectivity with respect to the stress layer 254 thereby facilitating subsequent removal of the stress layer 254. The stressor layer 250 may also be a single layered structure or comprise more than two layers provided the stressor layer 250 has a net tensile stress which enhances the mobility of carriers in an NMOS channel. In one embodiment, the net tensile stress of the stressor layer 250 may range from 0.5 to 2 GPa/cm$^2$.

In one embodiment, the liner layer is a silicon oxynitride (SiON) or silicon carbide (SiC) while the stress layer is a high tensile stress silicon nitride layer. Alternatively, other materials such as doped silicon or other combinations of layers may also be suitable provided the stressor layer 250 has a net tensile stress.

Exemplary methods for forming the stressor layer 140 include, but are not limited to chemical vapor deposition (CVD), physical vapor deposition (PVD), atomic layer deposition (ALD), high density plasma deposition (HDP) or thermal oxidation or a combination thereof. In one embodiment, the process parameters associated with the formation of the stressor layer 250 such as deposition temperature, pressure, ion bombardment during deposition may be tuned to form a layer with a desired level of stress.

In one embodiment, portions of the stressor layer 250 overlying other device regions such as PMOS transistor regions may be selectively removed prior to the subsequent stress memorization technique anneal step.

Figure 2E:
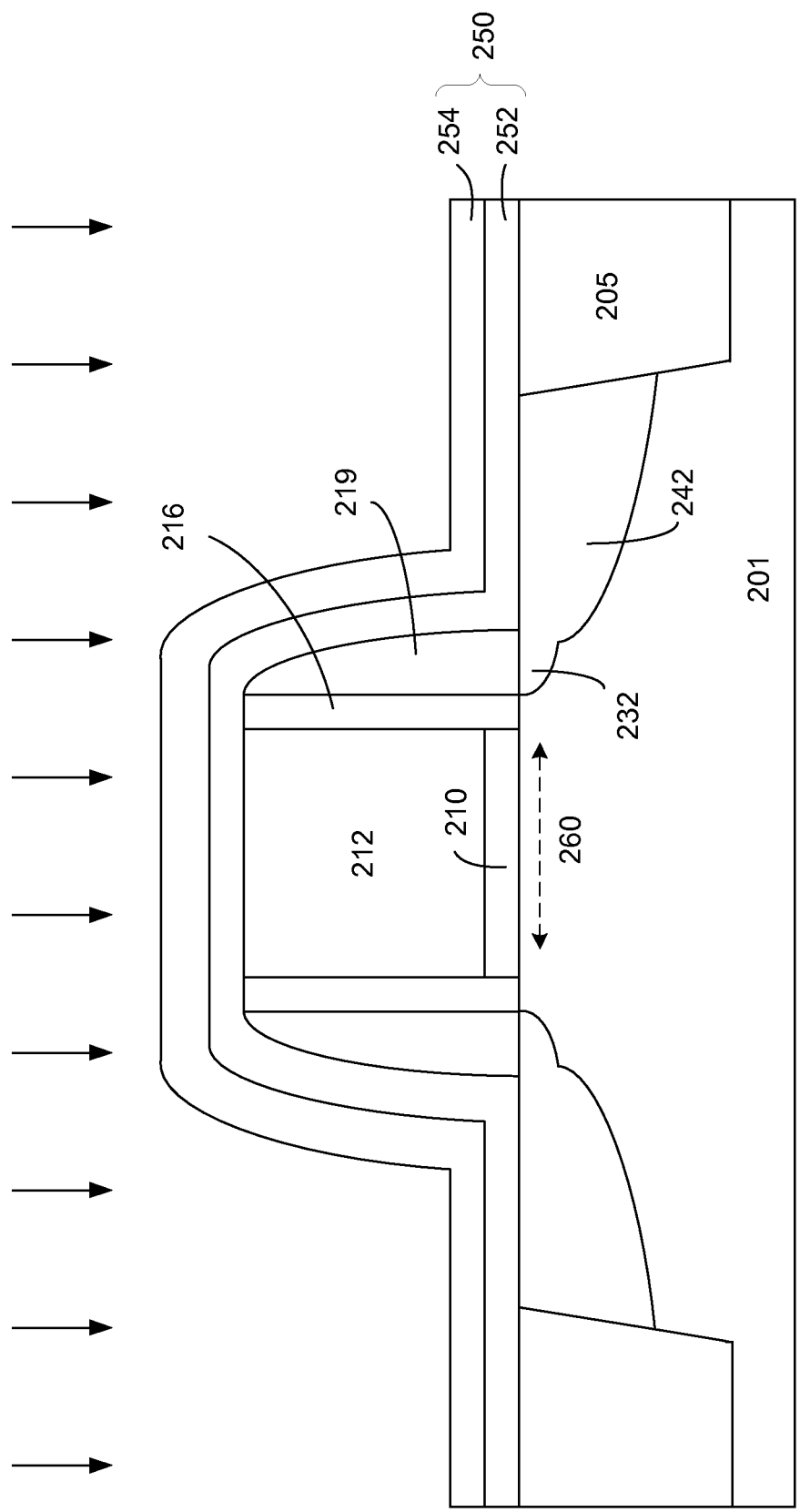

FIG. 2e shows the semiconductor structure 200 of FIG. 2d in a stress memorization technique (SMT) anneal step configured so that at least a portion of the tensile stress from stressor layer 250 is transmitted to and memorized by the NMOS in the form of tensile stress 260 along the lateral direction of the channel region 218. The tensile stress 260 induced by the stressor layer 250 enhances the mobility of carriers in the NMOS channel region and is more or less maintained even if the stressor layer 250 is subsequently removed. Without limiting ourselves to any particular theory, stress memorization may be caused by changes in portions of the gate electrode and/or substrate (such as re-crystallization) in the presence of an overlying stressor layer 250 during the SMT anneal.

Following the SMT anneal, a source/drain dopant activation anneal is carried out to activate dopants in the NSD stressor regions 242. However, the SMT and source/drain dopant activation anneal steps can result in the displacement of stressor atoms from substitutional sites to the extent that the stressor regions (232, 242) end up with a low atomic concentration of substitutional stressor atoms. This is undesirable because the stress induced by a stressor region decreases with a decrease in the atomic concentration of substitutional stressor atoms. Preferably, the atomic concentration of substitutional stressor atoms is least 1%.

The inventors have discovered that a combination of low temperature SMT anneal and a source/drain dopant activation laser spike anneal (LSA) can be used to ensure the presence of at least 1% of substitutional stressor atoms post anneal. In one embodiment, the concentration of substitutional stressor atoms present after various processing steps may be measured using x-ray diffraction.

A low temperature SMT anneal is an anneal process that is carried out at a temperature of 700° C. or less. The temperature range at the lower end being bounded by the need to effect the transfer of stress to and memorization of said transferred stress by the channel region 218. Comparison of transistor characteristics such as drive current may be used to determine the effectiveness of an SMT anneal. The inventors have discovered that a high temperature SMT anneal exceeding 700° C. can result in substantial displacement of stressor atoms from substitutional sites. Reducing the SMT anneal duration while maintaining a temperature above 700° C. does not mitigate this problem because the transfer and memorization of stress from the stressor layer to the channel region will be affected. For example, the inventors have found that a laser SMT anneal at 1200° C. causes the substitutional stressor concentration to fall below 1%. Reducing the SMT anneal duration to maintain the stressor concentration at 1% or above while maintaining a temperature above 700° C. does not mitigate the problem because this inhibits the transfer and memorization of stress from the stressor layer 250 to the channel region.

In a preferred embodiment, the temperature range for the SMT anneal is between 550 to 650° C. and even more preferably, a furnace anneal process is used so that there is an effective transfer of stress from the stressor layer 250 to the channel while mitigating displacement of stressor atoms from substitutional sites. In one embodiment, the SMT anneal comprises a furnace anneal at 650° C. for a duration of between 10 to 30 minutes.

Meanwhile the source/drain dopant activation LSA is a laser based anneal with a radiation duration in the sub millisecond range and an effective anneal temperature of more than 1000° C. The temperature range at the upper end is bounded by the melting temperature of the substrate and the need to minimize reductions in the atomic concentration of substitutional stressors. For example, in embodiments where the device is fabricated on a silicon substrate, the maximum effective temperature may be around 1300° C. so as to prevent the silicon substrate from melting.

In one embodiment, the stressor layer 250 is removed after SMT anneal. The stressor layer may be removed by an etch process that is selective with respect to the gate electrode 212 and the substrate material.

It will be appreciated by those skilled in the art that after source/drain activation anneal, additional conventional steps such as silicide contact formation, interconnect formation etc. can be performed as desired for the formation of an NMOS transistor.

The preferred embodiment of the invention is illustrative of the invention rather than limiting of the invention. It is to be understood that revisions and modifications may be made to methods, materials, structures and dimensions of a semiconductor structure while still providing a semiconductor that fall within the scope of the included claims. All matters hitherto-fore set forth herein or shown in the accompanying drawings are to be interpreted in an illustrative and non-limiting sense.

In an alternative embodiment, stressor atoms may be incorporated into source drain extension regions of a transistor by selective epitaxy instead of implantation followed by solid phase epitaxy. For example, trenches may be etched on opposed sides of a gate stack in designated source drain extension regions of the substrate. A selective epitaxy process is then used to fill the trenches with an epitaxial material having a sufficient percentage of substitutional stressor atoms so as to provide a stressor layer. Therefore, unlike the case where stressor atoms are introduced via implantation, there is no need for an additional anneal step to incorporate the stressor atoms into substitutional sites. In one embodiment, trenches are etched within a silicon substrate and selectively filled with an epitaxial silicon carbon alloy. Source drain extension dopants may be introduced into the epitaxial layer during the epitaxial growth process itself or via implantation into the epitaxial layer.

What is claimed is:

1. A method for fabricating a semiconductor device comprising:
    providing a substrate prepared with isolation regions;
    forming a gate stack having first and second sidewalls over a substrate;
    forming stressor diffusion extension regions within the substrate on opposed sides of the gate stack, wherein the stressor diffusion extension regions comprise a first concentration of stressor atoms incorporated into substitutional sites of diffusion extension regions;
    forming source/drain (S/D) stressor diffusion regions on opposed sides of the gate stack within the substrate, wherein the S/D stressor diffusion regions comprise a depth which is deeper than the diffusion extension regions and comprise the first concentration of stressor atoms incorporated into substitutional sites of S/D diffusion regions;
    forming a first stressor layer over the substrate after forming the stressor diffusion extension regions, the first stressor layer having a first stress value;
    performing a first anneal to memorize at least a portion of the first stress value in the semiconductor device, wherein the first anneal is conducted at a low temperature; and
    performing a second anneal with a laser based anneal to activate dopants in the S/D diffusion regions after the first anneal, wherein the first and second anneal prevent displacement of the stressor atoms having the first concentration from the substitutional sites and which are distributed throughout a width of diffusion extension and diffusion regions which extends from a sidewall of the gate to the isolation region.

2. The method of claim 1, wherein the first anneal to memorize at least a portion of the first stress value is conducted at a temperature of 700° C. or less.

3. The method of claim 1, wherein the first anneal to memorize at least a portion of the first stress value comprises annealing in a furnace environment.

4. The method of claim 1, further comprising removing the first stressor layer after the first anneal to memorize at least a portion of the first stress value.

5. The method of claim 1, wherein the diffusion extension regions are source/drain extension regions and the semiconductor device is a MOS transistor.

6. The method of claim 1, wherein the stressor atoms comprise carbon.

7. The method of claim 1 comprising:
forming first spacers along sidewalls of the gate stack, wherein the first spacers act as a mask during the formation of the stressor diffusion extension regions such that edges of the stressor diffusion extension regions are aligned with outer edges of the first spacers.

8. The method of claim 1 wherein the diffusion extension regions are source/drain extension regions and the semiconductor device is a MOS transistor.

9. The method of claim 1 wherein the atomic concentration of stressor atoms incorporated into the substitutional sites is at least 1% post first and second anneal.

10. The method of claim 1 wherein forming the stressor diffusion extension regions comprises performing a laser anneal to incorporate the stressor atoms into the substitutional sites and to convert the stressor diffusion extension regions into crystalline stressor regions.

11. The method of claim 1, wherein the second anneal comprises performing a laser spike anneal.

12. A method for fabricating a semiconductor device comprising:
providing a substrate prepared with isolation regions;
forming a gate stack having first and second sidewalls over a substrate;
forming stressor diffusion extension regions within the substrate on opposed sides of the gate stack, wherein the stressor diffusion extension regions are formed by implanting a first concentration of stressor atoms which are incorporated into substitutional sites of diffusion extension regions and distributed throughout a width of the diffusion extension regions; and
forming stressor diffusion regions by implanting the first concentration of stressor atoms which are incorporated into substitutional sites of diffusion regions and distributed throughout a width of the diffusion regions on opposed sides of the gate stack within the substrate, wherein the stressor diffusion regions comprise a depth which is deeper than a depth of the diffusion extension regions, and the stressor diffusion extension regions are located closer to an edge of the gate stack compared to the stressor diffusion regions, and wherein the first concentration of the stressor atoms are distributed throughout the width of diffusion extension and diffusion regions which extends from a sidewall of the gate to the isolation region.

13. The method of claim 12, wherein forming the stressor diffusion extension regions comprises:
introducing first type dopants to form the diffusion extension regions; and
introducing the stressor atoms, wherein the stressor atoms are confined within the diffusion extension regions.

14. The method of claim 13, wherein introducing the stressor atoms is performed after introducing the first type dopants.

15. The method of claim 13, wherein:
introducing the stressor atoms comprises implanting the stressor atoms into the substrate; and comprises
annealing the substrate to incorporate the stressor atoms into the substitutional sites of the substrate.

16. The method of claim 15, wherein the implant of the stressor atoms is tuned such that the stressor atoms are substantially confined within an upper portion of the diffusion extension regions.

17. The method of claim 15, wherein the stressor atoms are incorporated into the substitutional sites of the substrate using laser annealing.

18. The method of claim 13, comprising:
forming first spacers along sidewalls of the gate stack, wherein the first spacers act as a mask during introduction of the first type dopants and stressor atoms such that edges of the stressor diffusion extension regions are aligned with outer edges of the first spacers.

19. The method of claim 18, wherein forming the stressor diffusion regions comprises:
forming second spacers along sidewalls of the first spacers;
introducing first type dopants to form the diffusion regions; and
introducing stressor atoms, wherein the stressor atoms are confined within the diffusion regions to form the stressor diffusion regions.

20. A semiconductor device comprising:
a substrate having isolation regions;
a gate stack having first and second sidewalls disposed over a substrate;
stressor diffusion extension regions within the substrate on opposed sides of the gate stack, wherein the stressor diffusion extension regions comprise a first concentration of stressor atoms incorporated in substitutional sites of diffusion extension regions and which are distributed throughout a width of the diffusion extension regions; and
stressor diffusion regions having the first concentration of stressor atoms which are incorporated into substitutional sites of diffusion regions and distributed throughout a width of the diffusion regions within the substrate on opposed sides of the gate stack, wherein the stressor diffusion regions comprise a depth which is deeper than a depth of the diffusion extension regions, and wherein the stressor diffusion extension regions are located closer to an edge of the gate stack compared to the stressor diffusion regions, and wherein the first concentration of the stressor atoms are distributed throughout a width of diffusion extension and diffusion regions which extends from a sidewall of the gate to the isolation region.

21. A method for fabricating a semiconductor device comprising:
providing a substrate prepared with isolation regions;
forming a gate stack having first and second sidewalls over a substrate;
forming stressor diffusion extension regions within the substrate on opposed sides of the gate stack, wherein the stressor diffusion extension regions comprise stressor atoms incorporated into substitutional sites of diffusion extension regions;
forming source/drain (S/D) diffusion regions, wherein the S/D diffusion regions comprise a depth which is deeper than the diffusion extension regions;
forming a first stressor layer over the substrate after forming the stressor diffusion extension regions, the first stressor layer having a first stress value;
performing a first anneal to memorize at least a portion of the first stress value in the semiconductor device, wherein the first anneal is conducted at a low temperature; and performing a second anneal with a laser based anneal to activate dopants in the S/D diffusion regions after the first anneal, wherein the first and second anneal prevent displacement of the stressor atoms from the substitutional sites and which are distributed throughout a width of diffusion extension regions which extends from a sidewall of the gate to the isolation region.

\* \* \* \* \*